(12) United States Patent
Kao et al.

(10) Patent No.: US 9,589,840 B2
(45) Date of Patent: Mar. 7, 2017

(54) SEMICONDUCTOR PACKAGE AND MANUFACTURING METHOD THEREOF

(71) Applicant: Advanced Semiconductor Engineering, Inc., Kaohsiung (TW)

(72) Inventors: Chin-Li Kao, Kaohsiung (TW); Chang-Chi Lee, Kaohsiung (TW); Yi-Shao Lai, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 14/274,289

(22) Filed: May 9, 2014

(65) Prior Publication Data

US 2014/0332957 A1    Nov. 13, 2014

(30) Foreign Application Priority Data

May 9, 2013  (TW) .............. 102116464 A

(51) Int. Cl.
*H01L 23/48* (2006.01)
*H01L 21/768* (2006.01)
(Continued)

(52) U.S. Cl.
CPC ...... *H01L 21/76898* (2013.01); *H01L 21/486* (2013.01); *H01L 23/13* (2013.01);
(Continued)

(58) Field of Classification Search
CPC ........... H01L 2224/81; H01L 23/49827; H01L 2225/06513; H01L 23/49816; H01L 24/14;
(Continued)

(56) References Cited

U.S. PATENT DOCUMENTS 4,069,498 A    1/1978  Joshi
4,194,283 A    3/1980  Hoffmann
(Continued)

FOREIGN PATENT DOCUMENTS

CN    1591920        3/2005
CN    102497723 A    6/2012
(Continued)

OTHER PUBLICATIONS

English Translation of Search Report received in Chinese Patent Application No. 2013104003358 issued Jun. 24, 2015 received Sep. 24, 2015 (2 pages).
(Continued)

*Primary Examiner* — Khiem D Nguyen
(74) *Attorney, Agent, or Firm* — Foley & Lardner LLP; Cliff Z. Liu

(57) ABSTRACT

The present disclosure relates to a semiconductor package and a manufacturing method thereof. The semiconductor package includes a semiconductor element including a main body, a plurality of conductive vias, and at least one filler. The conductive vias penetrate through the main body. The filler is located in the main body, and a coefficient of thermal expansion (CTE) of the filler is different from that of the main body and the conductive vias. Thus, the CTE of the overall semiconductor element can be adjusted, so as to reduce warpage.

18 Claims, 11 Drawing Sheets

(51) Int. Cl.
  *H01L 23/367* (2006.01)
  *H01L 23/525* (2006.01)
  *H01L 23/532* (2006.01)
  *H01L 23/13* (2006.01)
  *H01L 23/14* (2006.01)
  *H01L 23/498* (2006.01)
  *H01L 21/48* (2006.01)
  *H01L 23/00* (2006.01)

(52) U.S. Cl.
  CPC ....... *H01L 23/147* (2013.01); *H01L 23/3677* (2013.01); *H01L 23/481* (2013.01); *H01L 23/49827* (2013.01); *H01L 23/525* (2013.01); *H01L 23/5329* (2013.01); *H01L 24/16* (2013.01); *H01L 2224/16225* (2013.01); *H01L 2224/16227* (2013.01); *H01L 2224/16238* (2013.01); *H01L 2224/73204* (2013.01); *H01L 2924/00014* (2013.01); *H01L 2924/35121* (2013.01)

(58) Field of Classification Search
  CPC ..... H01L 21/67898; H01L 2225/06541; H01L 2224/16145; H01L 21/486; H01L 21/563; H01L 2224/05147
  See application file for complete search history.

(56) References Cited

U.S. PATENT DOCUMENTS

| | | | |
|---|---|---|---|
| 5,399,898 A | 3/1995 | Rostoker | |
| 6,087,719 A * | 7/2000 | Tsunashima | H01L 21/76898 250/548 |
| 6,239,026 B1 | 5/2001 | Liu | |
| 6,831,367 B2 | 12/2004 | Sekine | |
| 6,921,718 B2 | 7/2005 | Andoh | |
| 7,528,480 B2 | 5/2009 | Mihara | |
| 7,687,916 B2 | 3/2010 | Lake | |
| 8,294,261 B2 | 10/2012 | Mawatari | |
| 2002/0028532 A1 | 3/2002 | Tsunashima | |
| 2002/0074615 A1* | 6/2002 | Honda | G01F 1/6845 257/508 |
| 2004/0061238 A1 | 4/2004 | Sekine | |
| 2006/0231960 A1* | 10/2006 | Su | H01L 21/563 257/787 |
| 2007/0221931 A1* | 9/2007 | Yamada | G02B 6/43 257/80 |
| 2008/0119046 A1 | 5/2008 | Sparks | |
| 2009/0243047 A1 | 10/2009 | Wolter | |
| 2010/0230759 A1 | 9/2010 | Yang | |
| 2011/0156267 A1 | 6/2011 | Cheng | |
| 2011/0156268 A1* | 6/2011 | Cheng | H01L 21/76898 257/774 |
| 2011/0186990 A1* | 8/2011 | Mawatari | H01L 23/3677 257/737 |
| 2011/0207322 A1* | 8/2011 | Yamaguchi | H01L 21/76898 438/667 |
| 2014/0070423 A1* | 3/2014 | Woychik | H01L 21/486 257/774 |

FOREIGN PATENT DOCUMENTS

| | | |
|---|---|---|
| CN | 102610709 A | 7/2012 |
| CN | 102870203 A | 1/2013 |
| JP | 2012-175099 A | 9/2012 |
| TW | I310234 | 5/2009 |
| TW | 201123348 A1 | 7/2011 |

OTHER PUBLICATIONS

Office Action and Search Report on Taiwanese Application No. 102116464 dated May 25, 2015, 9 pages.
Second Office Action and Search Report received for Chinese Patent Application No. 201310400335.8 issued Dec. 11, 2015, 9 pages with English translation of Search Report.

* cited by examiner

SEMICONDUCTOR PACKAGE AND MANUFACTURING METHOD THEREOF

CROSS REFERENCE TO RELATED APPLICATION

This application claims the benefit of Taiwan Patent Application No. 102116464, filed on May 9, 2013, the content of which is incorporated herein by reference in its entirety.

BACKGROUND

1. Technical Field

The present disclosure relates to a semiconductor package and a semiconductor process thereof, and more particularly to a semiconductor element and a semiconductor package including the semiconductor element, as well as a manufacturing method of the semiconductor element.

2. Description of the Related Art

A conventional stacked package generally includes a chip, a semiconductor element (e.g., an interposer) and a substrate. The chip is disposed on the semiconductor element and is electrically connected to the semiconductor element. The semiconductor element is connected to the substrate by using a plurality of solder balls. As the material of the semiconductor element is different from that of the substrate, their coefficients of thermal expansion (CTEs) are also typically different. When the conventional stacked package is heated, as the CTE of the material of the semiconductor element is different from that of the substrate, their degrees of warpage are different, which may result in that the solder balls are prone to damage. The main damage occurs at an interface between the solder balls and the semiconductor element, that is, the solder balls may be peeled from the semiconductor element; and the minor damage occurs in the solder balls, that is, the solder balls may fracture. Once the above damage occurs, an open circuit is formed between the semiconductor element and the substrate, so that the service life of the conventional stacked package is terminated, resulting in that reliability of the conventional stacked package cannot be improved. In addition, as the size of the semiconductor element becomes larger, the damage is more severe, and the reliability of the package is lower.

SUMMARY

One aspect of the present disclosure relates to a semiconductor element. In an embodiment, the semiconductor element includes a main body, at least one receiving space penetrating through the main body, a plurality of conductive vias, and at least one filler. The conductive vias penetrate through the main body. The filler is located in the main body, wherein a CTE of the filler is different from that of the main body and the conductive vias.

Another aspect of the present disclosure relates to a semiconductor package. In an embodiment, the semiconductor package includes a substrate, a semiconductor element, a plurality of solder balls, and at least one chip. The semiconductor element is located above the substrate, and includes a main body, a plurality of conductive vias, and at least one filler. The conductive vias penetrate through the main body. The filler is located in the main body, wherein a CTE of the filler is different from that of the main body and the conductive vias. The solder balls connect the substrate and the semiconductor element, and are electrically connected to the conductive vias. The chip is attached to the semiconductor element.

In the semiconductor package, adding the filler into the semiconductor element can adjust the CTE of the overall semiconductor element, so that serious warpage due to mismatch between CTEs after the semiconductor element is bonded to the substrate may not occur, or may occur to a low degree. Moreover, the main body is divided into a plurality of individual blocks by the filler; therefore, when the semiconductor element is heated, warpage occurs in the blocks individually and may not be accumulated, so that the degree of warpage of the semiconductor element as a whole can be greatly reduced. In addition, as the size of the semiconductor element becomes larger (e.g., greater than about 10 mm*about 10 mm), the above-mentioned effect of reducing warpage is more noticeable, thus, reliability of the semiconductor package is increased, and the number of chips stacked on the semiconductor element is increased.

A further aspect of the present disclosure relates to a manufacturing method of a semiconductor element. In an embodiment, the manufacturing method includes: (a) forming a plurality of holes and at least one receiving space on an upper surface of a main body; (b) forming a conductive via in each hole; (c) applying or forming at least one filler in the at least one receiving space, wherein a CTE of the filler is different from that of the main body and the conductive vias; (d) forming an upper redistribution layer and an upper protection layer on the upper surface of the main body, wherein the upper redistribution layer is connected to the conductive vias, the upper protection layer covers the upper redistribution layer, and the upper protection layer has at least one upper opening to expose part of the upper redistribution layer and forms at least one upper bump which is located in the upper opening of the upper protection layer and contacts the upper redistribution layer; (e) thinning the main body from a lower surface of the main body, to expose the conductive vias; and (f) forming a lower redistribution layer and a lower protection layer on the lower surface of the main body, wherein the lower redistribution layer is connected to the conductive vias, the lower protection layer covers the lower redistribution layer, and the lower protection layer has at least one lower opening to expose part of the lower redistribution layer and forms at least one lower bump which is located in the lower opening of the lower protection layer and contacts the lower redistribution layer.

DETAILED DESCRIPTION

Figure 1:
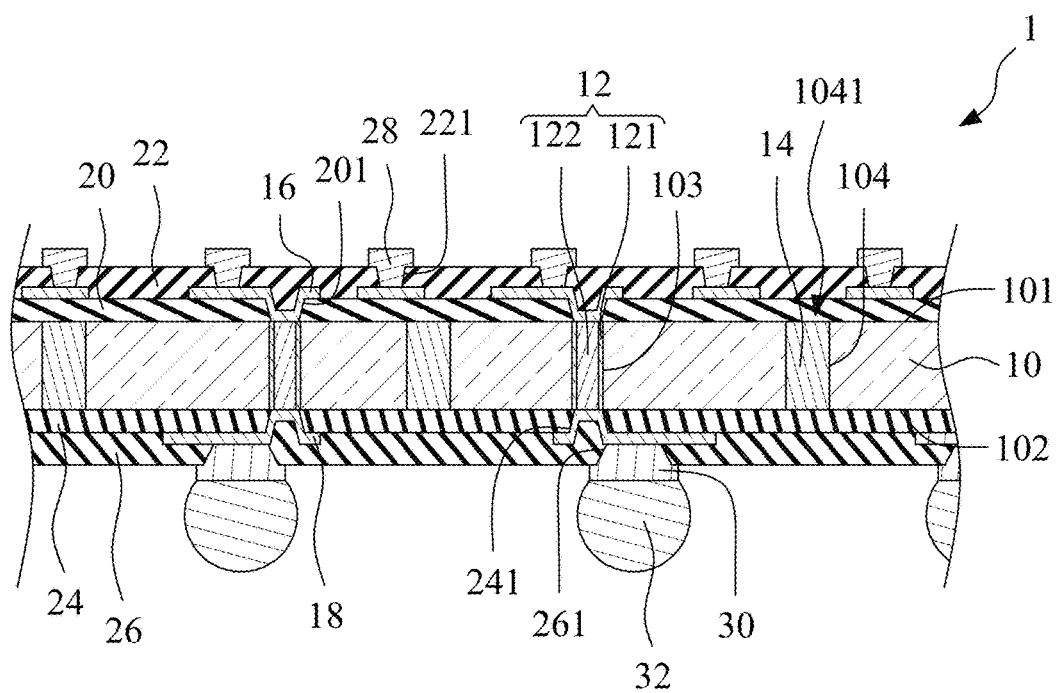
FIG. 1 is a schematic partial cross-sectional view of an embodiment of a semiconductor element according to the present disclosure.

FIG. 1 is a schematic partial cross-sectional view of an embodiment of a semiconductor element according to the present disclosure. The semiconductor element 1 includes a main body 10, a plurality of conductive vias 12, at least one filler 14, an upper redistribution layer 16, a lower redistribution layer 18, a first upper protection layer 20, a second upper protection layer 22, a first lower protection layer 24, a second lower protection layer 26, at least one upper bump 28, at least one lower bump 30, and a plurality of solder balls 32.

The material of the main body 10 may be or may include, for example, silicon, germanium, gallium arsenide or other semiconductor materials, such as another Group 14 element, another Group 13-15 binary alloy, a Group 14-14 binary alloy, a Group 12-16 binary alloy, or another binary, ternary, quaternary, or higher order alloy of Group 11 elements, Group 12 elements, Group 13 elements, Group 14 elements, Group 15 elements, Group 16 elements, and Group 17 elements. The main body 10 has an upper surface 101, a lower surface 102, a plurality of holes 103, and at least one receiving space 104. In this embodiment, the holes 103 are substantially cylindrical, and the diameter thereof is about 5 μm to about 200 μm, such as at least about 5 μm or at least about 10 μm, and up to about 200 μm or more. The receiving space 104 is a substantially linear trench, has the width of about 5 μm to about 200 μm, such as at least about 5 μm or at least about 10 μm, and up to about 200 μm or more, and has at least one first opening 1041 on the upper surface 101 of the main body 10. At least one receiving space 104 is located between at least two holes 103, and the length of a segment of the first opening 1041 on the upper surface 101 of the main body 10 is greater than the pitch between the two holes 103. In this embodiment, the holes 103 and the receiving space 104 all penetrate or extend through the main body 10; however, in other embodiments, the holes 103 penetrate through the main body 10, while the receiving space 104 may not penetrate through the main body 10. In addition, the conductive via 12 includes a liner 121 and a conductive metal 122. The liner 121 is formed of an insulating material, is located on a side wall of the hole 103, and defines a central hole. The material of the conductive metal 122 is, for example, copper, which fills the central hole and is exposed to the upper surface 101 and the lower surface 102 of the main body 10, to be used for electrical connection. Another conductive metal or other conductive material can be used in place of, or in combination with, copper.

The material of the filler 14 may be or may include, for example, a polymer or a metal, filled in the receiving space 104 of the main body 10. That is, the filler 14 is located between at least two conductive vias 12. In this embodiment, the material of the filler 14 is a polymer, and a CTE thereof is greater than about 10 parts-per-million (ppm)/° C.; the material of the main body 10 is silicon, and the CTE thereof is about 3 ppm/° C.; and the material of the conductive vias 12 is copper, and the CTE thereof is about 17 ppm/° C. Therefore, the CTE of the filler 14 is different from that of the main body 10 and the conductive vias 12, and the CTE of the filler 14 is greater than that of the main body 10, and, in this embodiment, the CTE of the filler 14 is smaller than that of the conductive vias 12. Examples of the material of the filler 14 include dielectric polymers, such as Polyimide (PI), and transition metals, such as nickel having a CTE of about 13.1 ppm/° C. Other examples of the material of the filler 14 include polymers and metals having a CTE greater than about 3 ppm/° C., such as at least or greater than about 4 ppm/° C., at least or greater than about 5 ppm/° C., at least or greater than about 8 ppm/° C., at least or greater than about 10 ppm/° C., and up to about 13 ppm/° C. or more, or up to about 15 ppm/° C. or more. It should be noted that, the filler 14 may not be used for electrical connection, and may not connect any circuit, even if the filler 14 is of a metallic material.

The upper redistribution layer 16 is adjacent to the upper surface 101 of the main body 10, and is connected to the conductive vias 12. In this embodiment, the upper redistribution layer 16 is located on the first upper protection layer 20 and in its openings 201, to contact the conductive vias 12.

The lower redistribution layer 18 is adjacent to the lower surface 102 of the main body 10, and is connected to the conductive vias 12. In this embodiment, the lower redistribution layer 18 is located on the first lower protection layer 24 and in its openings 241, to contact the conductive vias 12.

The first upper protection layer 20 covers the upper surface 101 of the main body 10, and has a plurality of openings 201 to expose the conductive vias 12. It should be noted that, the first upper protection layer 20 covers the filler 14. The material of the first upper protection layer 20 is, for example, Benzocyclobutene (BCB) or PI.

The second upper protection layer 22 is located on the first upper protection layer 20, and covers the upper redistribution layer 16. The second upper protection layer 22 has at least one upper opening 221 to expose part of the upper redistribution layer 16. The material of the second upper protection layer 22 is, for example, BCB or PI, and the materials of the first upper protection layer 20 and the second upper protection layer 22 may be the same or different. The first lower protection layer 24 covers the lower surface 102 of the main body 10, and has a plurality of openings 241 to expose the conductive vias 12. It should be noted that, the first lower protection layer 24 covers the filler 14. The material of the first lower protection layer 24 is, for example, BCB or PI.

The second lower protection layer 26 is located on the first lower protection layer 24, and covers the lower redistribution layer 18. The second lower protection layer 26 has at least one lower opening 261 to expose part of the lower redistribution layer 18. The material of the second lower protection layer 26 is, for example, BCB or PI, and the materials of the first lower protection layer 24 and the second lower protection layer 26 may be the same or different.

The upper bump 28 is located in the upper opening 221 of the second upper protection layer 22 and contacts the upper redistribution layer 16. The lower bump 30 is located in the lower opening 261 of the second lower protection layer 26 and contacts the lower redistribution layer 18. The solder balls 32 are connected to the lower bump 30. It should be understood that, the semiconductor element 1 may not include the solder balls 32.

Figure 2:
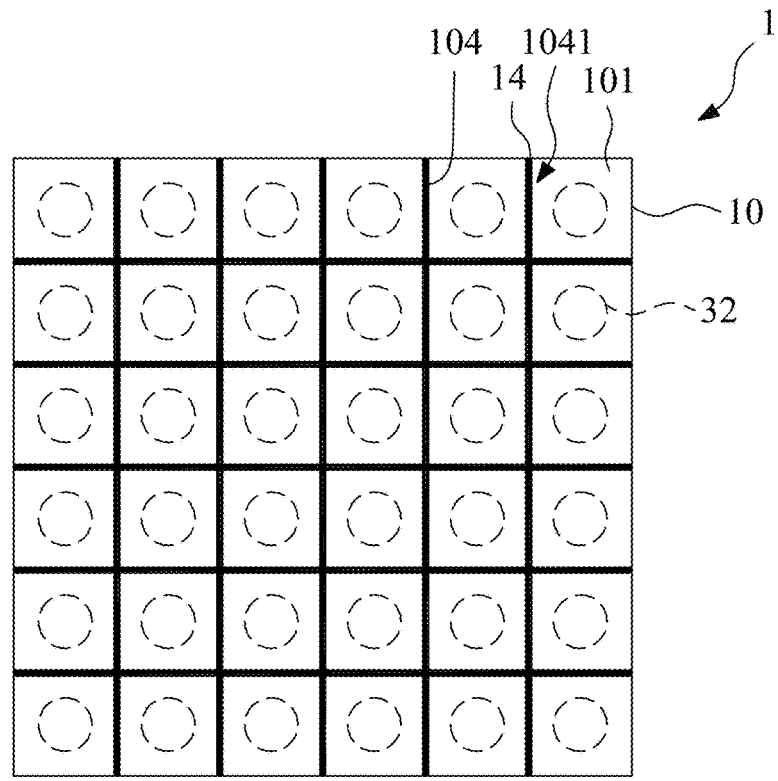
FIG. 2 is a schematic top view of the semiconductor element in FIG. 1, in which relative positions of a filler and solder balls are shown.

FIG. 2 is a schematic top view of the semiconductor element in FIG. 1, in which relative positions of the filler 14 and the solder balls 32 are shown.

The length of the first opening 1041 of the receiving space 104 on the upper surface 101 of the main body 10 is greater than the pitch between two solder balls 32. As shown in FIG. 2, the first opening 1041 forms a plurality of segments on the upper surface 101 of the main body 10, and the segments are arranged into a specific pattern, for example, a rectangular shape, an L shape, a cross shape or a grid shape. In this embodiment, the segments are arranged into a grid shape, and each solder ball 32 is located in a relative position of each grid. In addition, a ratio of the total area of all the first openings 1041 to the total surface area of the upper surface 101 of the main body 10 is about 5% to about 50%, such as about 5% to about 40%, about 5% to about 30%, or about 5% to about 20%. Referring to FIG. 2, the total surface area of the upper surface 101 of the main body 10 corresponds to a total area of an outer square-shaped boundary defining four sides of the semiconductor element 1, and the total surface area of the upper surface 101 of the main body 10 encompasses the total area of all the first openings 1041. In some embodiments, the total surface area of the upper surface 101 of the main body 10 may be referred to as the total surface area of an upper surface of the semiconductor element 1. Referring to FIG. 1 and FIG. 2, the main body 10 is divided into a plurality of individual (non-interconnected or isolated) blocks by the filler 14.

In the semiconductor element 1, addition of the filler 14 can adjust the CTE of the overall semiconductor element 1, so that serious warpage due to mismatch between CTEs after the semiconductor element 1 is bonded to another element (e.g., a printed circuit board (PCB)) may not occur, or may occur to a low degree. Moreover, the main body 10 is divided into a plurality of individual blocks by the filler 14; therefore, when the semiconductor element 1 is heated, warpage occurs in the blocks individually and may not be accumulated, so that the degree of warpage of the semiconductor element 1 as a whole can be greatly reduced. In addition, as the size of the semiconductor element 1 becomes larger (e.g., greater than about 10 mm*about 10 mm), the above-mentioned effect of reducing warpage is more noticeable, and reliability of the bonding structure is increased.

FIG. 3 to FIG. 9 are schematic views of an embodiment of a manufacturing method of a semiconductor element according to the present disclosure.

Figure 3:
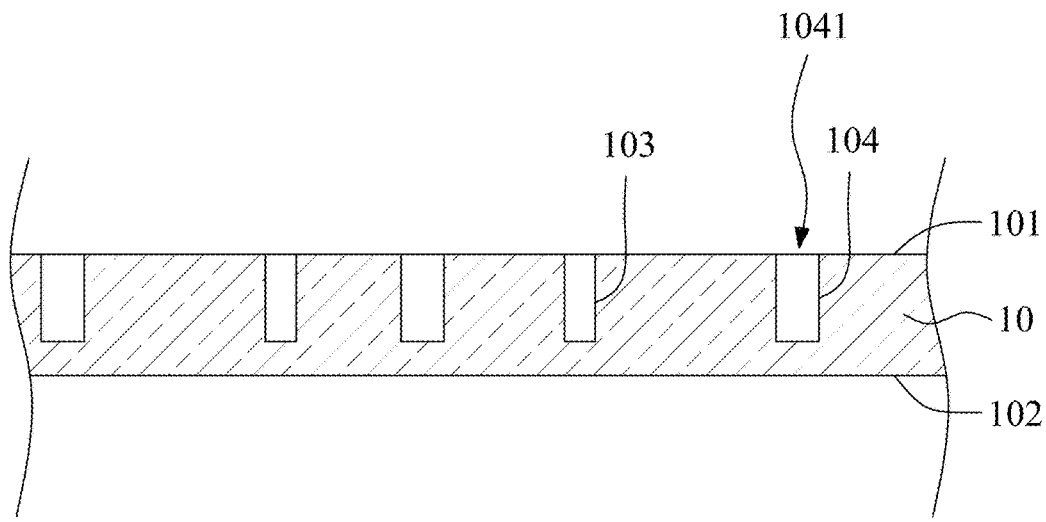
FIG. 3, FIG. 4, FIG. 5, FIG. 6, FIG. 7, FIG. 8, and FIG. 9 are schematic views of an embodiment of a manufacturing method of a semiconductor element according to the present disclosure.

Referring to FIG. 3, the main body 10 is provided. The material of the main body 10 may be, for example, silicon, germanium, gallium arsenide or other semiconductor materials, and the main body 10 has an upper surface 101 and a lower surface 102. Next, a plurality of holes 103 and at least one receiving space 104 are formed on the upper surface 101 of the main body 10. In this embodiment, the holes 103 are substantially cylindrical, and the diameter thereof is about 5 µm to about 200 µm. The receiving space 104 is a substantially linear trench, and has the width of about 5 µm to about 200 µm. In this step, the holes 103 and the receiving space 104 do not fully penetrate through the main body 10. In addition, the receiving space 104 is located between at least two holes 103.

The first opening 1041 forms a plurality of segments on the upper surface 101 of the main body 10 (as shown in FIG. 2), and the segments are arranged into a specific pattern, for example, a rectangular shape, an L shape, a cross shape or a grid shape. In this embodiment, the segments are arranged into a grid shape. In addition, a ratio of the total area of all the first openings 1041 to the total surface area of the upper surface 101 of the main body 10 is about 5% to about 50%, such as about 5% to about 20%.

Figure 4:
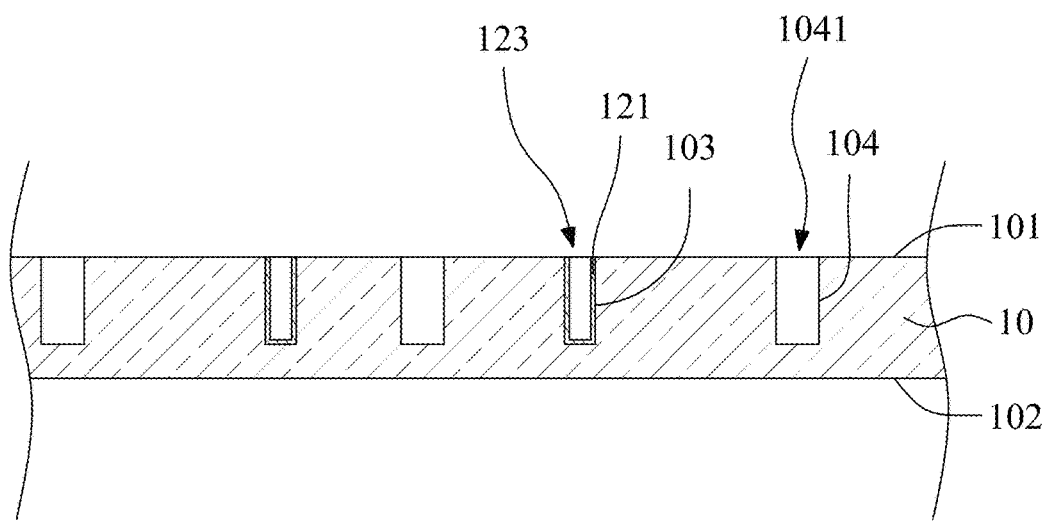

Referring to FIG. 4, the liner 121 is formed on a side wall of the hole 103, and a central hole 123 is defined. In this embodiment, the liner 121 is formed of an insulating material, and is selectively located on the side wall of the hole 103, instead of being located on a side wall of the receiving space 104.

Figure 5:
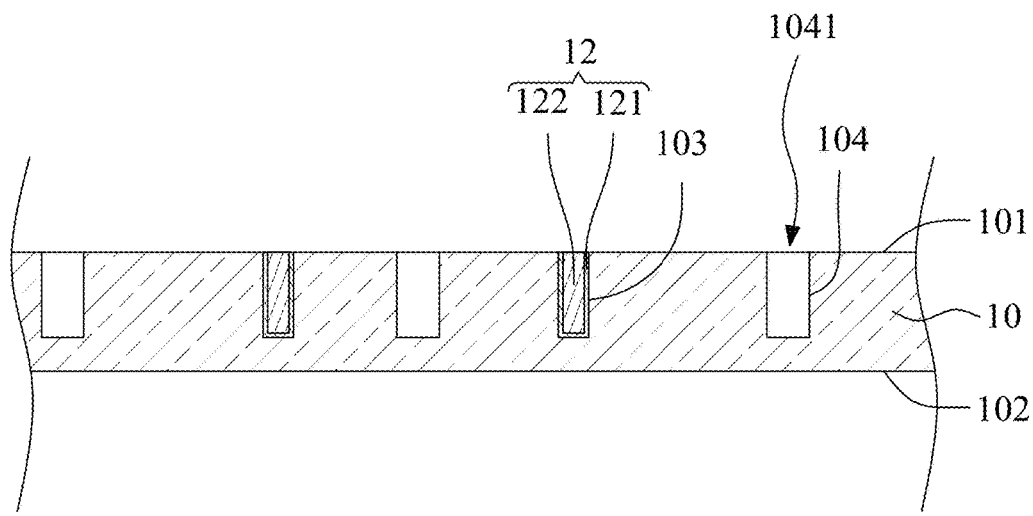

Referring to FIG. 5, the central hole 123 is filled with the conductive metal 122, so as to form a conductive via 12 in each hole 103. In this embodiment, the material of the conductive metal 122 is or includes, for example, copper.

Figure 6:
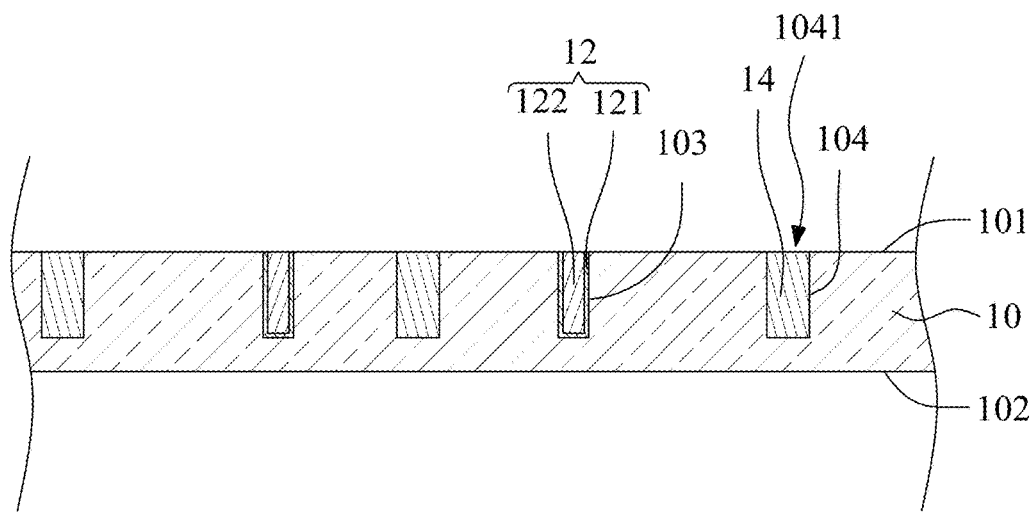

Referring to FIG. 6, the filler 14 is applied or formed in the receiving space 104. The material of the filler 14 is or includes, for example, a polymer or a metal, which fills the receiving space 104. In this embodiment, the filler 14 is a polymer, and the CTE thereof is greater than about 10 ppm/° C.; the material of the main body 10 is silicon, and the CTE thereof is about 3 ppm/° C.; and the material of the conductive vias 12 is copper, and the CTE thereof is about 17 ppm/° C. Therefore, the CTE of the filler 14 is different from that of the main body 10 and the conductive vias 12, and the CTE of the filler 14 is greater than that of the main body 10. It should be noted that, the filler 14 may not be used for electrical connection, and may not connect any circuit, even if the filler 14 is of a metallic material.

Figure 7:
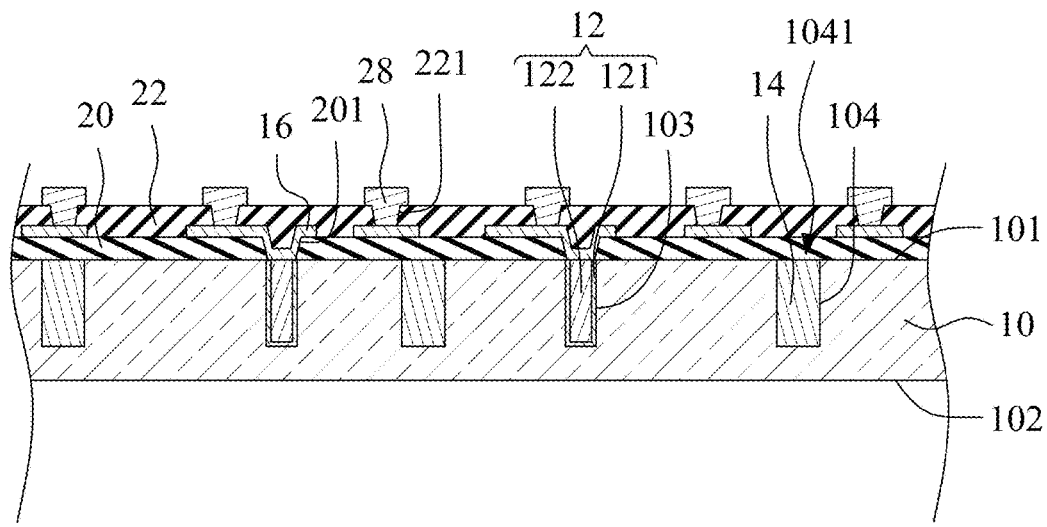

Referring to FIG. 7, the first upper protection layer 20, the upper redistribution layer 16, the second upper protection layer 22, and the upper bump 28 are formed on the upper surface 101 of the main body 10. The first upper protection layer 20 covers the upper surface 101 of the main body 10, and has a plurality of openings 201 to expose the conductive vias 12. It should be noted that, the first upper protection layer 20 covers the filler 14. The upper redistribution layer 16 is adjacent to the upper surface 101 of the main body 10, and is connected to the conductive vias 12. In this embodiment, the upper redistribution layer 16 is located on the first upper protection layer 20 and in its openings 201, to contact the conductive vias 12. The second upper protection layer 22 is located on the first upper protection layer 20, and covers the upper redistribution layer 16. The second upper protection layer 22 has at least one upper opening 221 to expose part of the upper redistribution layer 16. The materials of the first upper protection layer 20 and the second upper protection layer 22 are, for example, BCB or PI, and the materials of the first upper protection layer 20 and the second upper protection layer 22 may be the same or different. The upper bump 28 is located in the upper opening 221 of the second upper protection layer 22 and contacts the upper redistribution layer 16.

Figure 8:
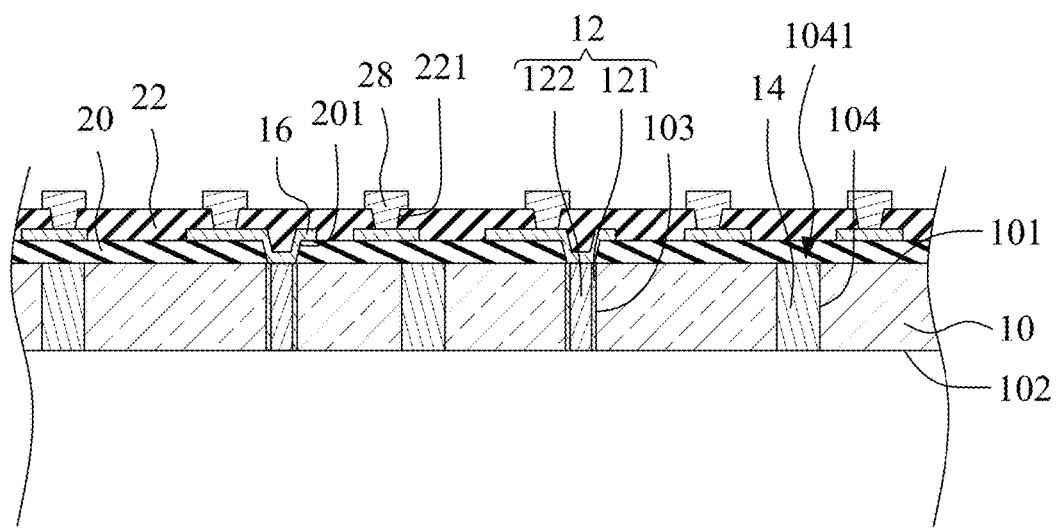

Referring to FIG. 8, the main body 10 is thinned from the lower surface 102 of the main body 10, to expose the conductive vias 12 and the filler 14. Meanwhile, the conductive vias 12 and the filler 14 all fully penetrate through the main body 10.

Figure 9:
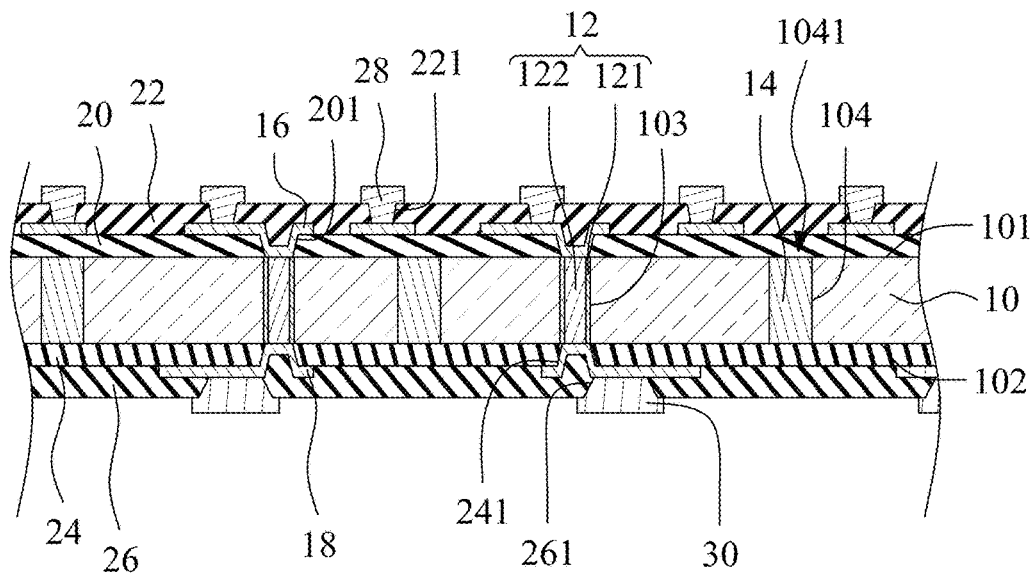

Referring to FIG. 9, the first lower protection layer 24, the lower redistribution layer 18, the second lower protection layer 26 and the lower bump 30 are formed on the lower surface 102 of the main body 10. The first lower protection layer 24 covers the lower surface 102 of the main body 10, and has a plurality of openings 241 to expose the conductive vias 12. It should be noted that, the first lower protection layer 24 covers the filler 14. The lower redistribution layer 18 is adjacent to the lower surface 102 of the main body 10, and is connected to the conductive vias 12. In this embodiment, the lower redistribution layer 18 is located on the first lower protection layer 24 and in its openings 241, to contact the conductive vias 12. The second lower protection layer 26 is located on the first lower protection layer 24, and covers the lower redistribution layer 18. The second lower protection layer 26 has at least one lower opening 261 to expose part of the lower redistribution layer 18. The materials of the first lower protection layer 24 and the second lower protection layer 26 are, for example, BCB or PI, and the materials of the first lower protection layer 24 and the second lower protection layer 26 may be the same or different. The lower bump 30 is located in the lower opening 261 of the second lower protection layer 26 and contacts the lower redistribution layer 18. Next, the solder balls 32 are formed on the lower bump 30, to form the semiconductor element 1, as shown in FIG. 1.

Figure 10:
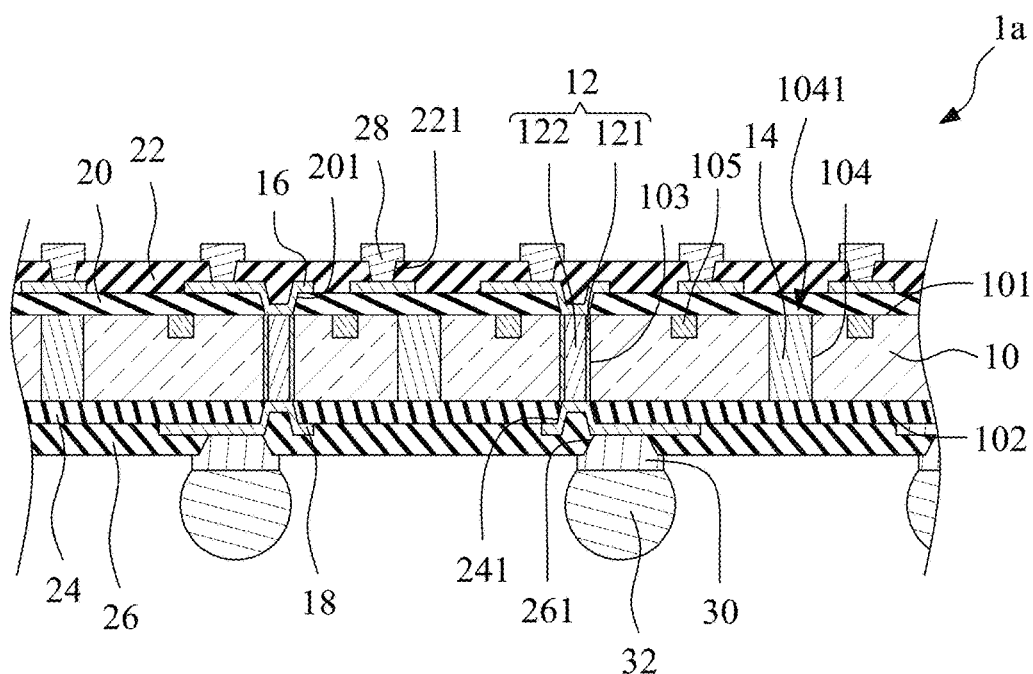
FIG. 10 is a schematic cross-sectional view of another embodiment of a semiconductor element according to the present disclosure.

FIG. 10 is a schematic cross-sectional view of another embodiment of a semiconductor element according to the present disclosure. The semiconductor element 1a in this embodiment and the semiconductor element 1 shown in FIG. 1 are substantially the same in certain respects, and their differences are as follows. In this embodiment, the semiconductor element 1a further includes a plurality of electrical elements (e.g., transistors 105 or other active or passive electrical elements), which are located on the upper surface 101 of the main body 10 and are covered by the first upper protection layer 20. It is also contemplated that electrical elements may be located on the lower surface 102 of the main body 10.

FIG. 11 to FIG. 14 are schematic views of another embodiment of a manufacturing method of a semiconductor element according to the present disclosure. In this embodiment, the "initial" process is the same as that in the manufacturing method in FIG. 3 to FIG. 6. The manufacturing method in this embodiment is subsequent to the step in FIG. 6.

Figure 11:
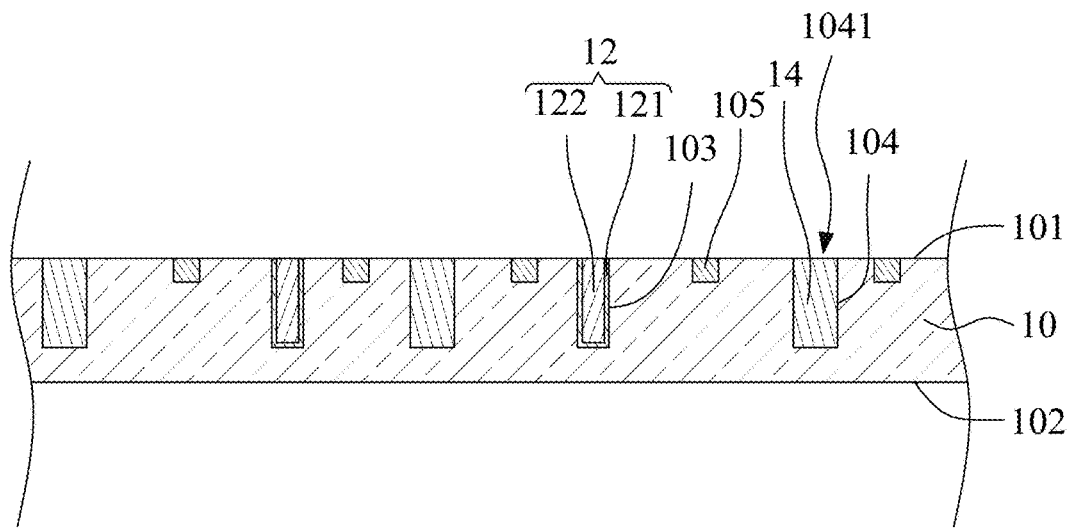
FIG. 11, FIG. 12, FIG. 13, and FIG. 14 are schematic views of another embodiment of a manufacturing method of a semiconductor element according to the present disclosure.

Referring to FIG. 11, after the conductive vias 12 and the filler 14 are applied or formed, the electrical elements (e.g., transistors 105) are further formed on the upper surface 101 of the main body 10.

Figure 12:
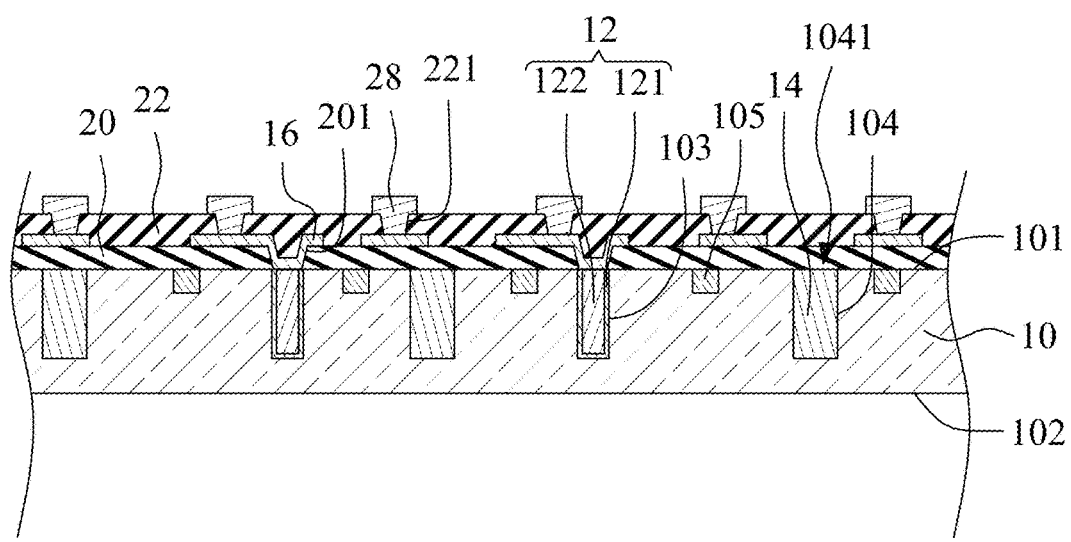

Referring to FIG. 12, the first upper protection layer 20, the upper redistribution layer 16, the second upper protection layer 22, and the upper bump 28 are formed on the upper surface 101 of the main body 10. It should be noted that, the first upper protection layer 20 covers the electrical elements.

Figure 13:
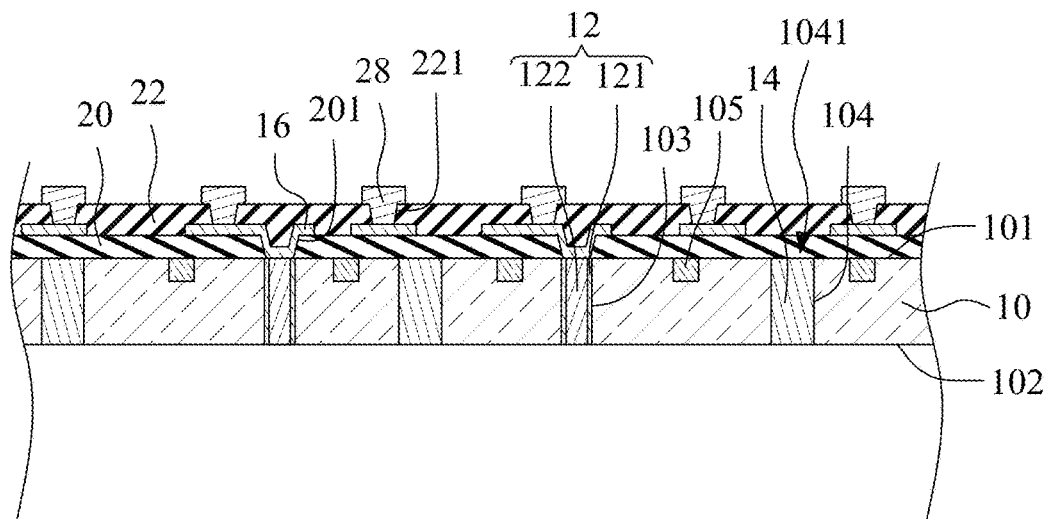

Referring to FIG. 13, the main body 10 is thinned from the lower surface 102 of the main body 10, to expose the conductive vias 12 and the filler 14. Meanwhile, the conductive vias 12 and the filler 14 all fully penetrate through the main body 10.

Figure 14:
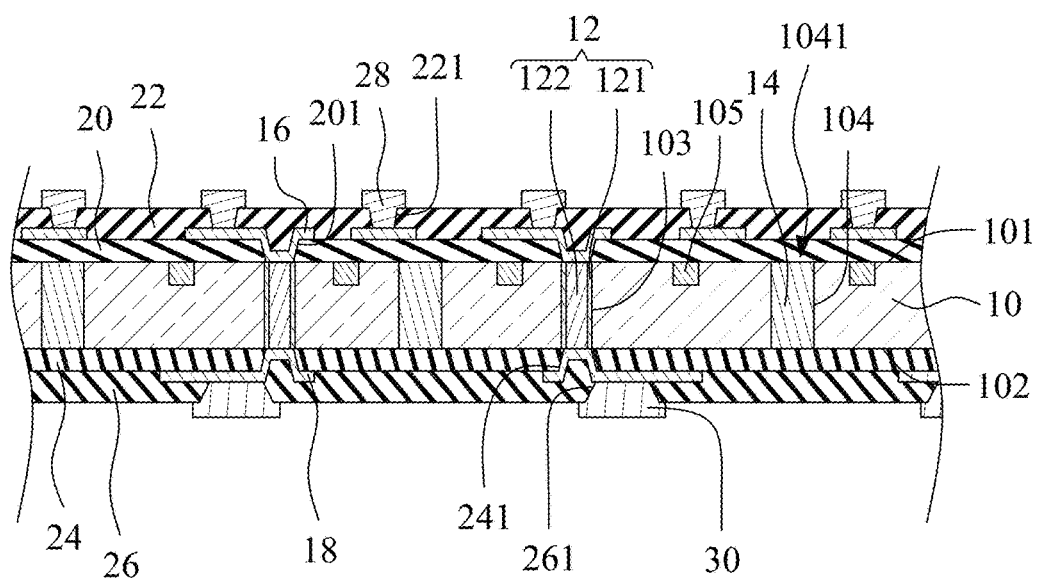

Referring to FIG. 14, the first lower protection layer 24, the lower redistribution layer 18, the second lower protection layer 26, and the lower bump 30 are formed on the lower surface 102 of the main body 10. Next, the solder balls 32 are formed on the lower bump 30, to form the semiconductor element 1a, as shown in FIG. 10.

Figure 15:
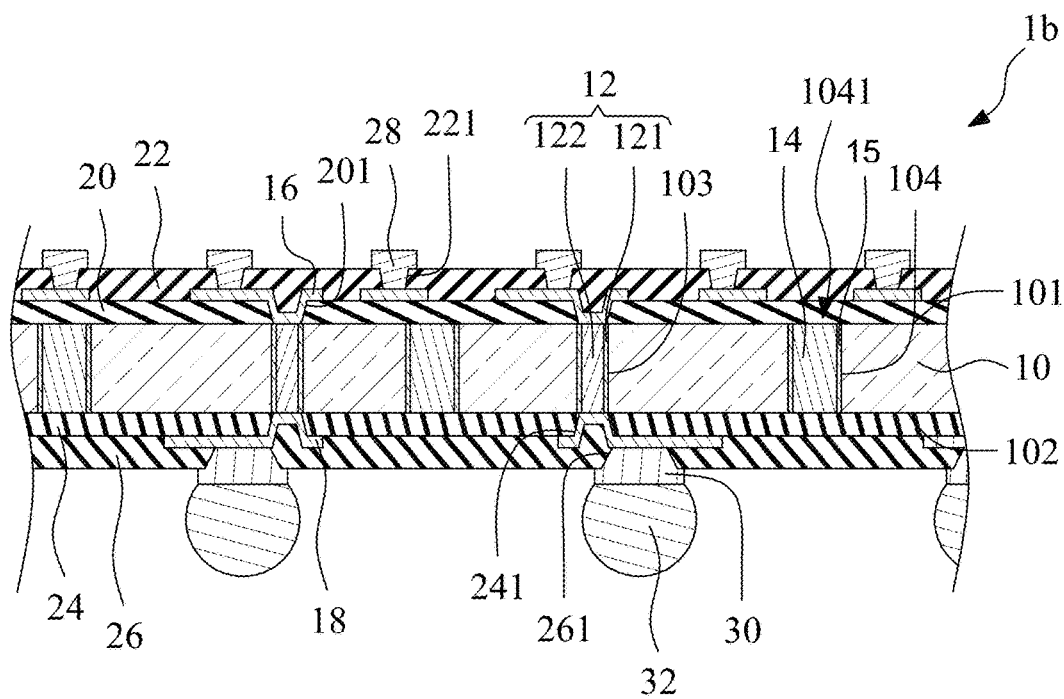
FIG. 15 is a schematic cross-sectional view of another embodiment of a semiconductor element according to the present disclosure.

FIG. 15 is a schematic cross-sectional view of another embodiment of a semiconductor element according to the present disclosure. The semiconductor element 1b in this embodiment and the semiconductor element 1 shown in FIG. 1 are substantially the same in certain respects, and their differences are as follows. In this embodiment, the semiconductor element 1b further includes at least one insulating layer 15 located between the filler 14 and the side wall of the receiving space 104. The material of the insulating layer 15 is the same as or may be different from that of the liner 121. In this embodiment, the material of the insulating layer 15 is the same as that of the liner 121, and the insulating layer 15 and the liner 121 are formed at the same time in the step of FIG. 4. In addition, due to the addition of the insulating layer 15, the filler 14 may be a metal, which can adjust the CTE of the overall semiconductor element 1b, but also can serve as a heat-dissipating path. It should be noted that, the filler 14 may not be used for electrical connection, and may not connect any circuit.

Figure 16:
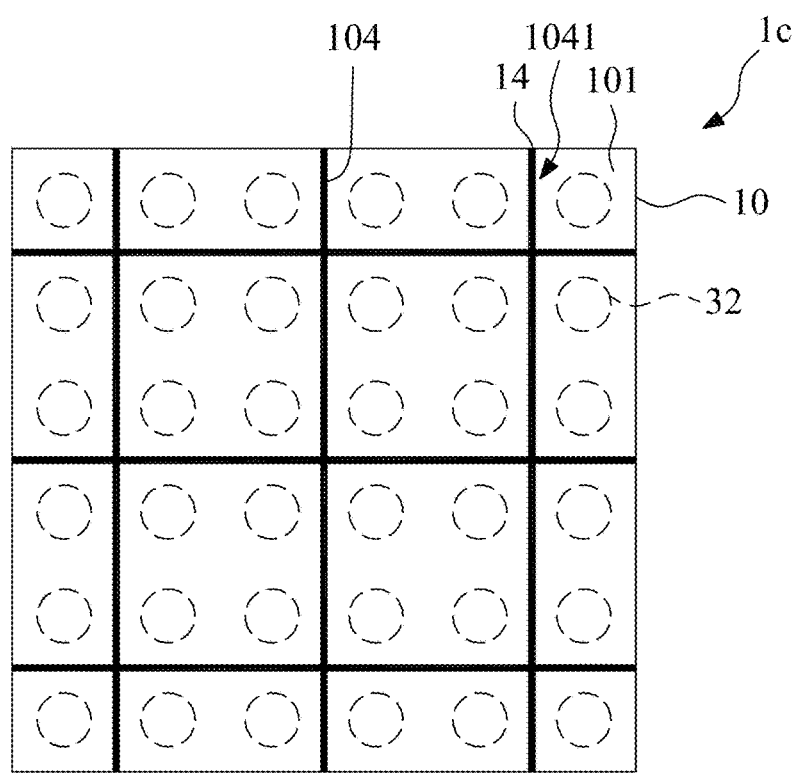
FIG. 16 is a schematic top view of another embodiment of a semiconductor element according to the present disclosure, in which relative positions of a filler and solder balls are shown.

FIG. 16 is a schematic top view of another embodiment of a semiconductor element according to the present disclosure, in which relative positions of the filler 14 and the solder balls 32 are shown. The semiconductor element 1c in this embodiment and the semiconductor element 1 shown in FIG. 2 are substantially the same in certain respects, and their differences are as follows. In this embodiment, the first opening 1041 of the semiconductor element 1c is arranged into a grid shape on the upper surface 101 of the main body 10, and a single grid (e.g., defined by two or more intersecting segments) is greater than that of the semiconductor element 1 shown in FIG. 2, wherein the single grid in the middle (e.g., defined by four intersecting segments) surrounds four solder balls 32.

Figure 17:
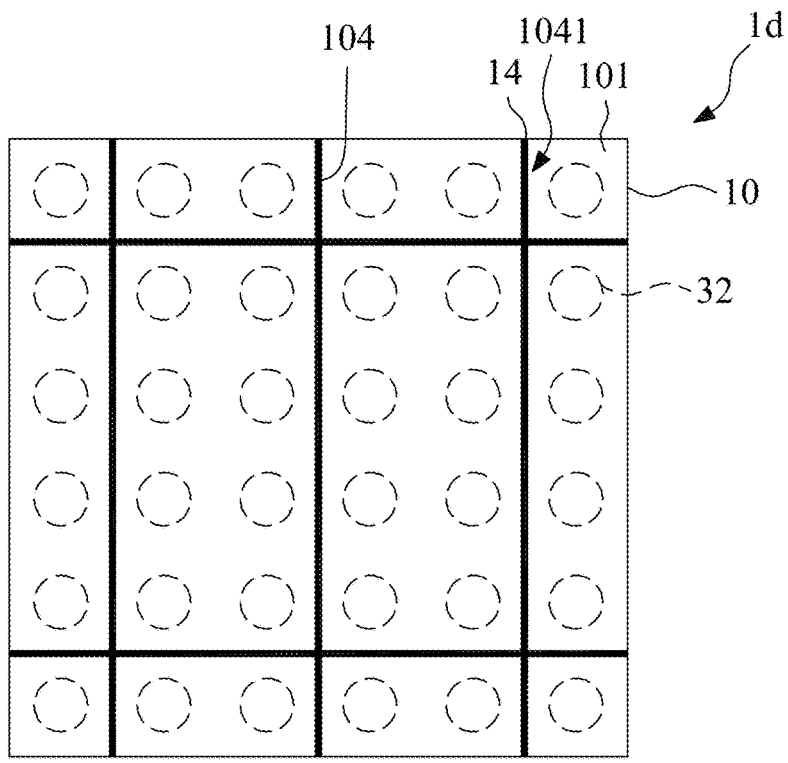
FIG. 17 is a schematic top view of another embodiment of a semiconductor element according to the present disclosure, in which relative positions of a filler and solder balls are shown.

FIG. 17 is a schematic top view of another embodiment of a semiconductor element according to the present disclosure, in which relative positions of the filler 14 and the solder balls 32 are shown. The semiconductor element 1d in this embodiment and the semiconductor element 1 shown in FIG. 2 are substantially the same in certain respects, and their differences are as follows. In this embodiment, the first opening 1041 of the semiconductor element 1d is arranged into a grid shape on the upper surface 101 of the main body 10, and a single grid (e.g., defined by two or more intersecting segments) is greater than that of the semiconductor element 1 shown in FIG. 2, where the single grid in the middle (e.g., defined by four intersecting segments) surrounds eight solder balls 32.

Figure 18:
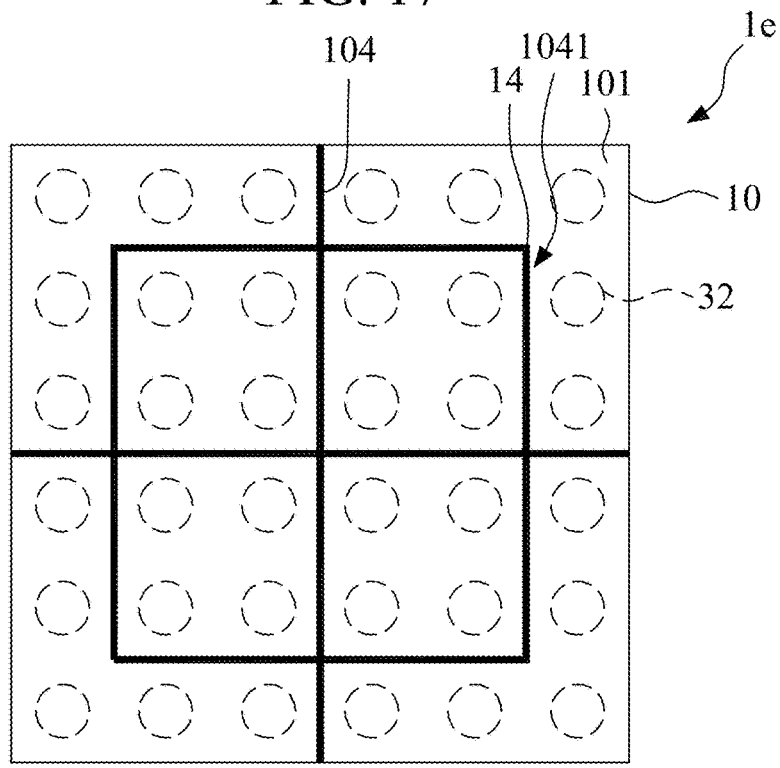
FIG. 18 is a schematic top view of another embodiment of a semiconductor element according to the present disclosure, in which relative positions of a filler and solder balls are shown.

FIG. 18 is a schematic top view of another embodiment of a semiconductor element according to the present disclosure, in which relative positions of the filler 14 and the solder balls 32 are shown. The semiconductor element 1e in this embodiment and the semiconductor element 1 shown in FIG. 2 are substantially the same in certain respects, and their differences are as follows. In this embodiment, the first opening 1041 of the semiconductor element 1e is arranged into a rectangular shape and a cross shape on the upper surface 101 of the main body 10, wherein the cross shape may be regarded as a combination of two L shapes.

Figure 19:
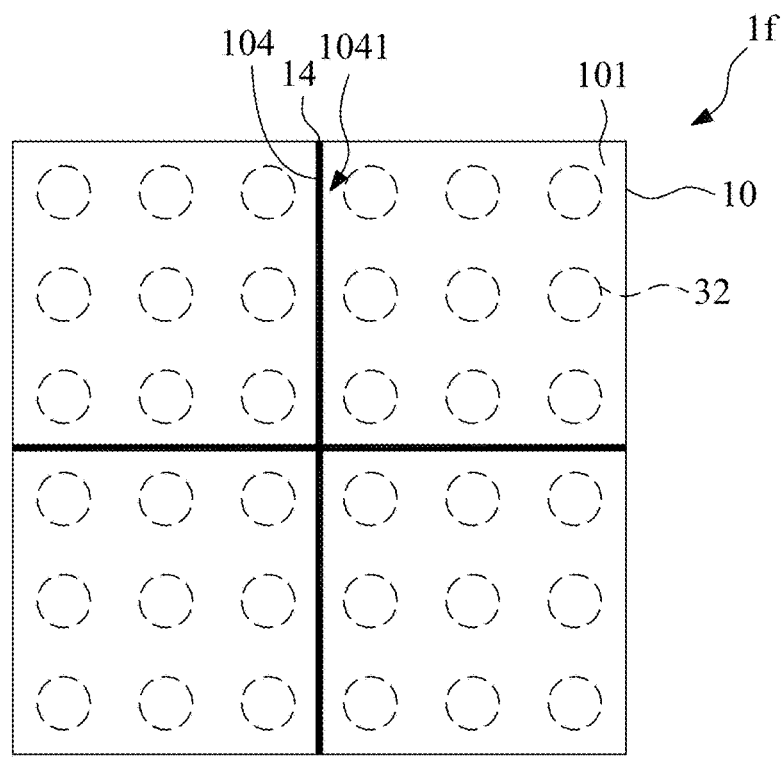
FIG. 19 is a schematic top view of another embodiment of a semiconductor element according to the present disclosure, in which relative positions of a filler and solder balls are shown.

FIG. 19 is a schematic top view of another embodiment of a semiconductor element according to the present disclosure, in which relative positions of the filler 14 and the solder balls 32 are shown. The semiconductor element 1f in this embodiment and the semiconductor element 1 shown in FIG. 2 are substantially the same in certain respects, and their differences are as follows. In this embodiment, the first opening 1041 of the semiconductor element if is arranged into a cross shape or two L shapes on the upper surface 101 of the main body 10.

Figure 20:
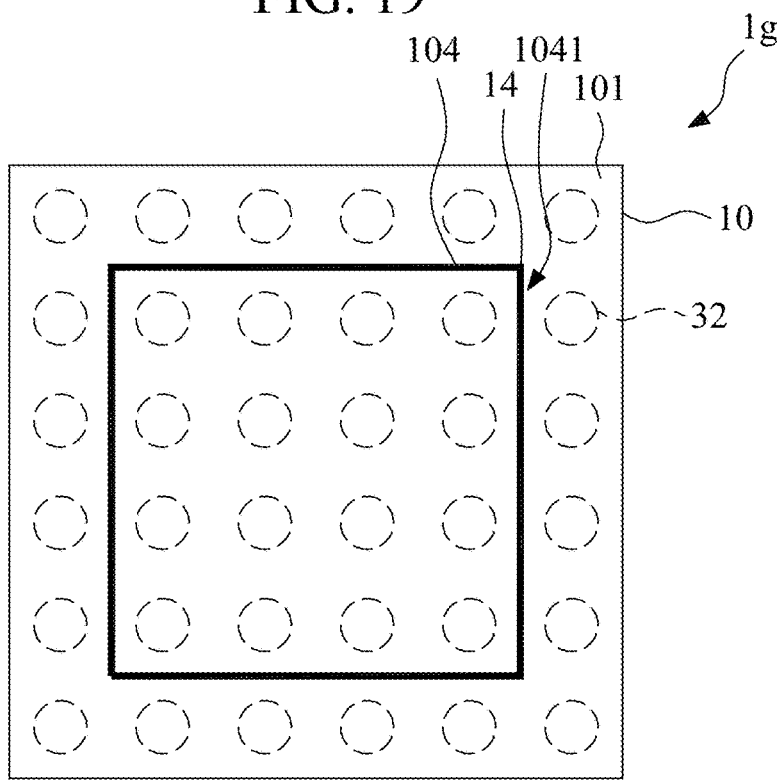
FIG. 20 is a schematic top view of another embodiment of a semiconductor element according to the present disclosure, in which relative positions of a filler and solder balls are shown.

FIG. 20 is a schematic top view of another embodiment of a semiconductor element according to the present disclosure, in which relative positions of the filler 14 and the solder balls 32 are shown. The semiconductor element 1g in this embodiment and the semiconductor element 1 shown in FIG. 2 are substantially the same in certain respects, and their differences are as follows. In this embodiment, the first opening 1041 of the semiconductor element 1g is arranged into a rectangular shape on the upper surface 101 of the main body 10.

Figure 21:
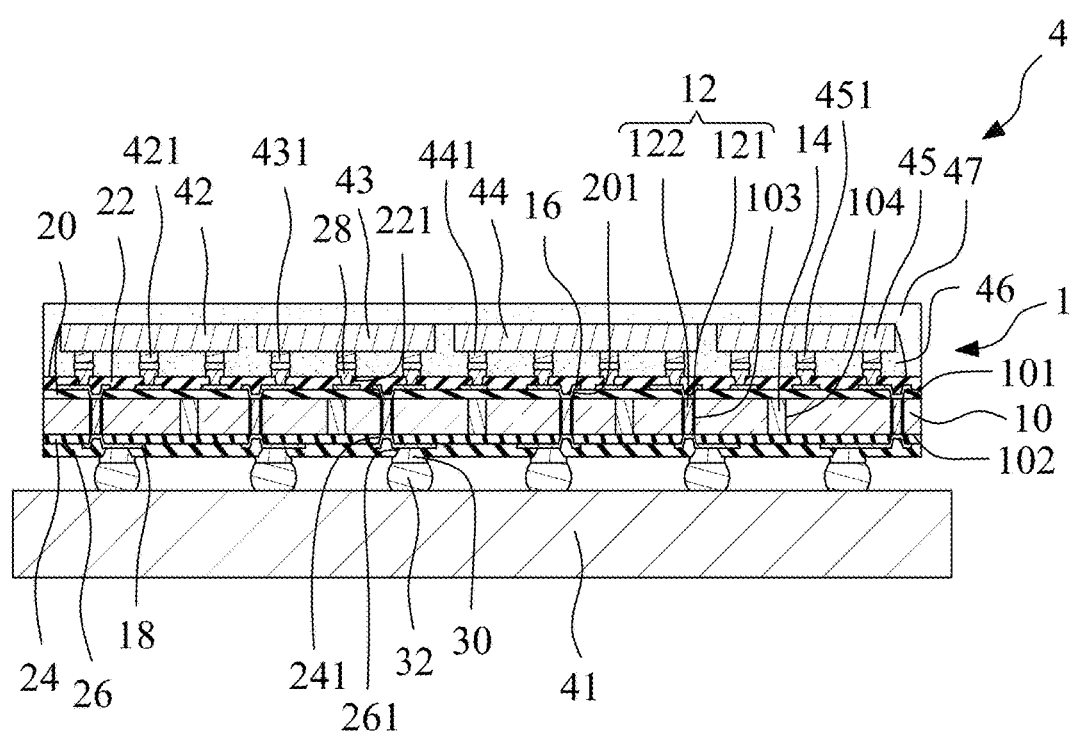
FIG. 21 is a schematic cross-sectional view of an embodiment of a semiconductor package according to the present disclosure.

FIG. 21 is a schematic cross-sectional view of an embodiment of a semiconductor package according to the present disclosure. The semiconductor package 4 includes a substrate 41, a semiconductor element 1, a plurality of solder balls 32, at least one chip (e.g., chip 42), an underfill 46, and a molding compound 47. In this embodiment, the substrate 41 is a PCB substrate. The semiconductor element 1 is located above the substrate 41. The semiconductor element 1 is the same as the semiconductor element 1 shown in FIG.

1 and FIG. 2; however, the semiconductor element 1 also can be replaced with the semiconductor element 1a in FIG. 10, the semiconductor element 1b in FIG. 15, the semiconductor element 1c in FIG. 16, the semiconductor element 1d in FIG. 17, the semiconductor element 1e in FIG. 18, the semiconductor element 1f in FIG. 19 or the semiconductor element 1g in FIG. 20. The solder balls 32 connect the substrate 41 and the lower bump 30 of the semiconductor element 1, and are electrically connected to the conductive vias 12.

The at least one chip (e.g., chip 42) is disposed on the semiconductor element 1, and is electrically connected to the semiconductor element 1. In this embodiment, the at least one chip includes a first chip 42 (e.g., Bluetooth (BT) chip), a second chip 43 (e.g., radio frequency (RF) chip), a third chip 44 (e.g., power management (PMIC) chip) and a fourth chip 45 (e.g., detector). The first chip 42 includes a plurality of first bumps 421 connected to the upper bumps 28. The second chip 43 includes a plurality of second bumps 431 connected to the upper bumps 28. The third chip 44 includes a plurality of third bumps 441 connected to the upper bumps 28. The fourth chip 45 includes a plurality of fourth bumps 451 connected to the upper bumps 28.

The underfill 46 is located between the chips 42, 43, 44 and 45 and the semiconductor element 1, so as to protect the first bumps 421, the second bumps 431, the third bumps 441, the fourth bumps 451, and the upper bumps 28. The molding compound 47 is located on the semiconductor element 1, to cover an upper surface of the chips 42, 43, 44 and 45. In other embodiments, the molding compound 47 may be omitted, and the underfill 46 is used to cover the bumps 421, 431, 441 and 451 and the upper bumps 28. Alternatively, the underfill 46 may be omitted, and the molding compound 47 is used to protect the chips 42, 43, 44 and 45, the bumps 421, 431, 441 and 451, and the upper bumps 28. In addition, the materials of the underfill 46 and the molding compound 47 are the same or may be different.

In the semiconductor package 4, adding the filler 14 to the semiconductor element 1 can adjust the CTE of the overall semiconductor element 1, so that serious warpage due to mismatch between CTEs after the semiconductor element 1 is bonded to the substrate 41 may not occur, or may occur to a low degree. Moreover, the main body 10 is divided into a plurality of individual blocks by the filler 14; therefore, when the semiconductor element 1 is heated, warpage occurs in the blocks individually and may not be accumulated, so that the degree of warpage of the semiconductor element 1 as a whole can be greatly reduced. In addition, as the size of the semiconductor element 1 becomes larger (e.g., greater than about 10 mm*about 10 mm), the above-mentioned effect of reducing warpage is more noticeable, thus, reliability of the semiconductor package 4 is increased, and the number of stacked chips (e.g., the chips 42, 43, 44 and 45) is increased.

Table 1 is a table of comparisons between simulation results of normal stresses that the protection layer is subject to in a bonding structure when different types of semiconductor elements in the present disclosure are bonded to a substrate by using the solder balls 32, wherein the comparison example is a conventional structure, and the filler 14 is not added. Example 1 is the semiconductor element 1 of FIG. 2, wherein a ratio of the total area of all the first openings 1041 to the total surface area of the upper surface 101 of the main body 10 is about 40%; Example 2 is the semiconductor element 1c of FIG. 16, wherein a ratio of the total area of all the first openings 1041 to the total surface area of the upper surface 101 of the main body 10 is about 20%; Example 3 is the semiconductor element 1d of FIG. 17, wherein a ratio of the total area of all the first openings 1041 to the total surface area of the upper surface 101 of the main body 10 is about 10%; Example 4 is the semiconductor element 1e of FIG. 18, wherein a ratio of the total area of all the first openings 1041 to the total surface area of the upper surface 101 of the main body 10 is about 5%; Example 5 is the semiconductor element 1f of FIG. 19, wherein a ratio of the total area of all the first openings 1041 to the total surface area of the upper surface 101 of the main body 10 is about 2.5%; and Example 6 is the semiconductor element 1g of FIG. 20, wherein a ratio of the total area of all the first openings 1041 to the total surface area of the upper surface 101 of the main body 10 is about 2.5%. The material of the semiconductor element is silicon, the filler 14 is a polymer, and the protection layer refers to the first lower protection layer 24.

TABLE 1

Simulation results of normal stresses that the protection layer of different types of semiconductor elements is subject to

| | Thickness (µm) of the semiconductor element | Ratio of the total area of the first opening to the total surface area of the upper surface of the main body | Underfill | Height (µm) of the solder balls | Material of the protection layer | Maximum normal stress (MPa) that the protection layer is subject to at −40° C. | Tensile strength (MPa) of the protection layer | Safety factor (strength/stress) |
|---|---|---|---|---|---|---|---|---|
| Comparison example | 100 | — | None | 140 | BCB | 88.7 | 87 | 0.98 |
| Example 1 | 100 | 40% | None | 140 | BCB | 65.4 | 87 | 1.33 |
| Example 2 | 100 | 20% | None | 140 | BCB | 41.1 | 87 | 2.12 |
| Example 3 | 100 | 10% | None | 140 | BCB | 66.0 | 87 | 1.32 |
| Example 4 | 100 | 5% | None | 140 | BCB | 89.7 | 87 | 0.97 |
| Example 5 | 100 | 2.5% | None | 140 | BCB | 89.5 | 87 | 0.97 |
| Example 6 | 100 | 2.5% | None | 140 | BCB | 88.9 | 87 | 0.98 |

It can be seen from Table 1 that the safety factors of Example 1 to Example 3 are all noticeably increased, and Example 4 to Example 6 are about the same as the comparison example, and it can be seen from the simulation results of Table 1 that, when the ratio of the total area of the first openings 1041 to the total surface area of the upper surface 101 of the main body 10 is greater than about 5%, a better safety factor, for example, greater than about 1.00 can be obtained.

Table 2 is a table of comparisons between simulation results of solder fatigue life in a bonding structure when different types of semiconductor elements in the present disclosure are bonded to a substrate by using the solder balls 32, wherein parameters of the comparison example and Example 1 to Example 6 are the same as those in the above Table 1.

a main body in the range of about 5% to about 50% should be understood to include the explicitly recited limits of about 5% and about 50%, but also to include individual values such as about 10%, about 15%, about 20%, about 25%, and about 40%, and sub-ranges such as about 5% to about 10%, about 10% to about 30%, about 30% to about 50%, and so forth.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

TABLE 2

Simulation results of solder fatigue life of different types of semiconductor elements

| | Thickness (μm) of the semiconductor element | Ratio of the total area of the first opening to the total surface area of the upper surface of the main body | Underfill | Height (μm) of the solder balls | Material of the protection layer | Creep Strain Energy Density (MPa/cycle) of the solder balls | Characteristic Life (cycles) of the solder balls | Performance (%) |
|---|---|---|---|---|---|---|---|---|
| Comparison example | 100 | — | None | 140 | BCB | 0.4686 | 747 | Baseline |
| Example 1 | 100 | 40% | None | 140 | BCB | 0.0418 | 8787 | 1076 |
| Example 2 | 100 | 20% | None | 140 | BCB | 0.0090 | 42101 | 5532 |
| Example 3 | 100 | 10% | None | 140 | BCB | 0.0226 | 16489 | 2106 |
| Example 4 | 100 | 5% | None | 140 | BCB | 0.2238 | 1588 | 113 |
| Example 5 | 100 | 2.5% | None | 140 | BCB | 0.2546 | 1392 | 86 |
| Example 6 | 100 | 2.5% | None | 140 | BCB | 0.3215 | 1098 | 47 |

It can be seen from Table 2 that the performances of Example 1 to Example 3 are all noticeably increased, and the performances of Example 4 to Example 6 are slightly higher than that of the comparison example, and it can be seen from the simulation results in Table 2 that, when the ratio of the total area of the first openings 1041 to the total surface area of the upper surface 101 of the main body 10 is greater than about 5%, an improved performance, for example, greater than about 1000% can be obtained.

As used herein, the terms "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio of the total area of all first openings to the total surface area of The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. A semiconductor element, comprising:
   a main body defining at least one receiving space penetrating through the main body;
   a plurality of conductive vias penetrating through the main body; and
   at least one filler located in the receiving space, wherein a coefficient of thermal expansion (CTE) of the filler is different from that of the main body and the conductive vias, and the filler is located between at least two conductive vias;

wherein the at least one receiving space has at least one first opening on a surface of the main body, and a length of the first opening is greater than a pitch between two conductive vias, wherein the filler divides the main body into a plurality of individual blocks, wherein the plurality of individual blocks are fully isolated from one another by the filler.

2. The semiconductor element according to claim 1, wherein the main body defines a plurality of holes penetrating through the main body, each of the conductive vias includes a liner and a conductive metal, the liner is located on a side wall of a respective hole and defines a central hole, and the central hole is filled with the conductive metal.

3. The semiconductor element according to claim 1, wherein a ratio of a total area of all the at least one first opening to a total surface area of the surface of the main body is 5% to 50%.

4. The semiconductor element according to claim 1, wherein the at least one first opening forms at least one segment on the surface of the main body, and the at least one segment is arranged in a rectangular shape, an L shape, a cross shape, or a grid shape.

5. The semiconductor element according to claim 1, wherein a material of the main body is a semiconductor material, and a material of the filler is a polymer or a metal.

6. The semiconductor element according to claim 1, further comprising at least one insulating layer, located between the filler and a side wall of the receiving space.

7. The semiconductor element according to claim 1, wherein the main body further comprises a plurality of electrical elements.

8. A semiconductor package, comprising:
a substrate;
a semiconductor element located above the substrate, the semiconductor element comprising:
a main body defining at least one receiving space penetrating through the main body;
a plurality of conductive vias penetrating through the main body; and
at least one filler located in the receiving space, wherein a coefficient of thermal expansion (CTE) of the filler is different from that of the main body and the conductive vias, and the filler is located between at least two conductive vias;
wherein the at least one receiving space has at least one first opening on a surface of the main body, and a length of the first opening is greater than a pitch between two conductive vias;
wherein the filler divides the main body into a plurality of individual blocks;
wherein the plurality of individual blocks are fully isolated from one another by the filler;
a plurality of solder balls connecting the substrate and the semiconductor element, and electrically connected to the conductive vias; and
at least one chip including at least one bump, disposed above the semiconductor element.

9. The semiconductor package according to claim 8, wherein a ratio of a total area of all the at least one first opening to a total surface area of the surface of the main body is 5% to 50%.

10. The semiconductor package according to claim 8, further comprising an underfill covering the at least one bump.

11. The semiconductor package according to claim 8, further comprising a molding compound covering an upper surface of the at least one chip.

12. The semiconductor package according to claim 8, wherein the main body further comprises a plurality of electrical elements.

13. The semiconductor package according to claim 8, wherein the filler fully surrounds a lateral periphery of at least one of the plurality of individual blocks.

14. A semiconductor element, comprising:
a semiconductor body, the semiconductor body defining a plurality of openings extending from a top surface of the semiconductor body to a bottom surface of the semiconductor body, the plurality of openings including at least two first openings and at least one second opening positioned between the at least two first openings;
an upper redistribution layer disposed at the top surface of the semiconductor body;
a lower redistribution layer disposed at the bottom surface of the semiconductor body;
at least two conductive vias respectively disposed in the at least two first openings, the at least two conductive vias electrically connected to the upper redistribution layer and the lower redistribution layer; and
at least one filler respectively disposed in the at least one second opening, wherein a coefficient of thermal expansion (CTE) of the at least one filler is greater than a CTE of the semiconductor body, and the CTE of the at least one filler is different from a CTE of the at least two conductive vias, and the filler is located between the at least two conductive vias,
wherein a length of the at least one second opening is greater than a pitch between two conductive vias,
wherein the filler divides the semiconductor body into a plurality of individual blocks;
wherein the plurality of individual blocks are fully isolated from one another by the filler.

15. The semiconductor element of claim 14, wherein the CTE of the least one filler is less than the CTE of the at least two conductive vias.

16. The semiconductor element of claim 14, wherein the at least one second opening is a plurality of second openings and the at least one filler is a plurality of fillers respectively disposed in the plurality of second openings, wherein the plurality of fillers divide the semiconductor body into the plurality of individual blocks.

17. The semiconductor element of claim 14, wherein the at least one filler is a conductive material, and the at least one filler is electrically isolated from the upper redistribution layer and the lower redistribution layer.

18. The semiconductor element of claim 14, wherein the filler fully surrounds a lateral periphery of at least one of the plurality of individual blocks.

* * * * *